(12) United States Patent
Kawahito et al.

(10) Patent No.: US 10,132,927 B2
(45) Date of Patent: Nov. 20, 2018

(54) DISTANCE MEASUREMENT DEVICE

(71) Applicant: National University Corporation Shizuoka University, Shizuoka-shi, Shizuoka (JP)

(72) Inventors: Shoji Kawahito, Hamamatsu (JP); Keita Yasutomi, Hamamatsu (JP)

(73) Assignee: NATIONAL UNIVERSITY CORPORATION SHIZUOKA UNIVERSITY (JP)

( * ) Notice: Subject to any disclaimer, the term of this patent is extended or adjusted under 35 U.S.C. 154(b) by 414 days.

(21) Appl. No.: 14/889,945

(22) PCT Filed: Apr. 4, 2014

(86) PCT No.: PCT/JP2014/059947
§ 371 (c)(1),
(2) Date: Nov. 9, 2015

(87) PCT Pub. No.: WO2014/181619
PCT Pub. Date: Nov. 13, 2014

(65) Prior Publication Data
US 2016/0124091 A1    May 5, 2016

(30) Foreign Application Priority Data
May 10, 2013  (JP) ................. 2013-100657

(51) Int. Cl.
G01S 17/10      (2006.01)
G01S 7/486      (2006.01)
H01L 27/146     (2006.01)
G01S 17/89      (2006.01)

(52) U.S. Cl.
CPC .......... G01S 17/102 (2013.01); G01S 7/4863 (2013.01); G01S 7/4865 (2013.01); G01S 17/10 (2013.01);
(Continued)

(58) Field of Classification Search
CPC ...... G01S 17/10; G01S 17/102; G01S 7/4863; G01S 7/4866; G01S 7/4865; H01L 27/14603; H01L 27/14609; H01L 27/1461
See application file for complete search history.

(56) References Cited

U.S. PATENT DOCUMENTS 9,832,409 B2 * 11/2017 Kawahito ......... H01L 27/14609
2002/0074530 A1 * 6/2002 Mizuno .................... G01C 3/06
                                                            250/559.38
2013/0307968 A1   11/2013 Forster ........................ 348/135

FOREIGN PATENT DOCUMENTS

JP   2007-121116 A   5/2007
JP   2012-215481 A   11/2012
(Continued)

OTHER PUBLICATIONS

Notice of Allowance dated Dec. 5, 2017 in counterpart Japanese Patent Application No. 2015-515821.
(Continued)

Primary Examiner — Eric L Bolda
(74) Attorney, Agent, or Firm — Ostrolenk Faber LLP

(57) ABSTRACT

A distance measurement device according to one aspect of the present invention includes a photoelectric conversion device which includes a light receiving unit, a charge storage unit, a charge discharge unit, and a gate electrode, a controller which controls an irradiation timing of pulse light having a pulse width which is sufficiently shorter than response time of the light receiving unit to an object and performs control to generate control pulse voltages having at least two kinds of phases based on the irradiation timing and to apply it to the gate electrode, a charge reading unit which reads a first and second charges stored in the charge storage unit according to the applications of the respective control pulse voltages having two kinds of phases as a first and second electrical signals, and a calculation unit which cal-
(Continued)

culates a distance to the object based on the first and second electrical signals.

14 Claims, 12 Drawing Sheets

(52) U.S. Cl.
CPC .......... *G01S 17/89* (2013.01); *H01L 27/1461* (2013.01); *H01L 27/14603* (2013.01); *H01L 27/14609* (2013.01)

(56) References Cited

FOREIGN PATENT DOCUMENTS

| | | |
|---|---|---|
| JP | 2012-217060 A | 11/2012 |
| WO | WO 2008/069141 A1 | 6/2008 |

OTHER PUBLICATIONS

International Search Report for International Application No. PCT/JP2014/059947 dated Jul. 1, 2014.
PCT/IB/338 Form PCT Notification of Transmittal of Translation of the International Preliminary Report on Patentability with Form PCT/ISA/237 PCT Translation of Written Opinion of the International Searching Authority dated Nov. 19, 2015.
T. Spirig et al., "The lock-in CCD-dimensional synchronous detection of light", IEEE Journal of Quantum Electronics, Sep. 1995, p. 1705-p. 1708.
S. Kawahito et al., "A CMOS time-of-flight range image sensor with gates-on-field-oxide structure", IEEE Sensors Journal, Dec. 2007, p. 1578-p. 1586.

\* cited by examiner (a)

(b)

DISTANCE MEASUREMENT DEVICE

CROSS-REFERENCE TO RELATED APPLICATIONS

The present application is a 35 U.S.C. §§ 371 national phase conversion of PCT/JP2014/059947, filed Apr. 4, 2014, which claims priority to Japanese Patent Application No. 2013-100657, filed May 10, 2013, the contents of both of which are incorporated herein by reference. The PCT International Application was published in the Japanese language.

TECHNICAL FIELD

The present invention relates to a distance measurement device which detects a distance to an object by measuring flight time of light.

BACKGROUND ART

Conventionally, a distance measurement image sensor such as a CCD (Charge Coupled Device) image sensor and a CMOS (Complementary Metal Oxide Semiconductor) image sensor for using TOF (Time Of Flight) in which a distance can be measured by measuring flight time of light has been realized. Purposes of most of the conventional distance measurement image sensors are to measure the distance in a range from several meters to several to tens meters. A resolution of the measurement is from several millimeters to several centimeters.

Modulation methods of the distance measurement image sensors are generally classified into a pulse modulation system (refer to Non Patent Literature 1) and a sinusoidal wave modulation system (refer to Non Patent Literature 2). Both systems detect a signal, which depends on delay time of light, by performing lock-in detection in the sensor and calculate a distance based on the signals of a plurality of phases. In the pulse modulation system, a distance resolution is proportional to a pulse width of a light source and is inversely proportional to the square root of the number of stored electrons. In the sinusoidal wave modulation system, the distance resolution is inversely proportional to a frequency of sinusoidal wave modulation and the square root of the number of stored electrons. Accordingly, the resolution can be improved by shortening the pulse width of the light source and increasing the number of stored electrons or by making the modulation frequency high and increasing the number of stored electrons.

CITATION LIST

Non Patent Literature

[Non Patent Literature 1] S. Kawahito et al., "A CMOS time-of-flight range image sensor with gates-on-field-oxide structure"; IEEE Sensors Journal, Vol. 7, No. 12, pp. 1578-1586, December 2007.

[Non Patent Literature 2] T. Spirig et al., "The lock-in CCD-two-dimensional synchronous detection of light", IEEE Journal of Quantum Electronics, Vol. 31, No. 9, pp. 1705-1708, September 1995.

SUMMARY OF INVENTION

Technical Problem

However, in order to realize the resolution of equal to or less than 10 μm with one million stored electrons in the conventional pulse modulation system, the pulse width which is equal to or less than 100 psec is required. Therefore, it is difficult to generate a pulse waveform of the light source and a response waveform of a sensor with high accuracy. Also, in the conventional sinusoidal wave modulation system, the modulation frequency which is equal to or higher than three GHz is similarly required, and it is difficult to supply a pulse signal for demodulation at the time of the lock-in detection. As a result, it is difficult to detect a distance with improved resolution and high accuracy by using the conventional modulation method.

The present invention has been made in consideration of the above problem. A purpose of the present invention is to provide a distance measurement device which can detect a distance with improved resolution and high accuracy.

Solution to Problem

To solve the problem, a distance measurement device according to one aspect of the present invention includes a photoelectric conversion device which includes a light receiving unit for converting incident light into a charge, a charge storage unit for storing the charge, a charge discharge unit for discharging the charge, and a gate electrode for controlling transfer of the charge from the light receiving unit to the charge storage unit and transfer of the charge from the light receiving unit to the charge discharge unit, a controller which controls an irradiation timing of pulse light having a pulse width which is sufficiently shorter than response time of the light receiving unit to an object and performs control to generate control pulse voltages having at least two kinds of phases based on the irradiation timing and to apply it to the gate electrode, a charge reading unit which respectively reads a first and second charges stored in the charge storage unit according to the applications of the respective control pulse voltages having two kinds of phases as a first and second electrical signals, and a calculation unit which calculates a distance to the object based on the first and second electrical signals.

According to the distance measurement device, the irradiation timing of the pulse light having the pulse width which is sufficiently shorter than the response time of the light receiving unit to the object is controlled, and control pulse voltages having two kinds of phases based on the irradiation timing are applied to the gate electrode. Accordingly, the charge which has been converted according to the incidence of the pulse light by the light receiving unit can be stored in the charge storage unit by modulating it. The first and second charges modulated by the control pulse voltages having two kinds of phases are read as the first and second electrical signals by the charge reading unit, and the distance to the object is calculated by the calculation unit based on the first and second electrical signals. In this way, the distance is calculated by using the response characteristics of the impulse light of the light receiving unit. Therefore, deterioration in measurement accuracy caused by deterioration in a sensor response waveform according to the change of a time width of the incident light waveform can be prevented. As a result, distance detection with improved resolution and high accuracy can be realized.

The calculation unit may calculate the distance based on a ratio between the first and second electrical signals by approximating impulse response characteristics of the light receiving unit. By having the calculation unit like this, the resolution of the measured distance is determined by the number of stored charges of the light receiving unit and the response time of the light receiving unit. Accordingly, deterioration in the measurement accuracy due to deterioration of the sensor response waveform according to a change of a time width of an incident light waveform can be surely prevented.

For example, the calculation unit may approximate the impulse response characteristics of the light receiving unit by a linear function or a quadratic function.

Also, the controller performs control to generate more control pulse voltages having phases different from the two kinds of phases, and the charge reading unit further reads a third charge stored in the charge storage unit according to the application of the control pulse as a third electrical signal. The calculation unit may calculate the distance to the object based on the first and second electrical signals corrected by the third electrical signal. In this case, offset charges included in the first and second charges can be canceled as the third charge. Therefore, the accuracy of the calculated distance can be further improved.

In addition, the photoelectric conversion device may have a plurality of light receiving units arranged therein. With this structure, a traveling distance of the charge from being converted by the light receiving unit to being stored by the storage unit can be shortened, and both light receiving sensitivity and high-speed modulation can be achieved. As a result, sensitivity and a response speed of the distance measurement device can be improved.

In addition, the photoelectric conversion device may further include a buffer circuit, and the control pulse voltage may be applied to the gate electrode via the buffer circuit. When the buffer circuit is included, the control pulse voltage is applied to the gate electrode via the buffer circuit with a small load. Therefore, the deterioration in the waveform of the control pulse voltage is prevented, and the accuracy of the measured distance can be improved.

Advantageous Effects of Invention

According to one aspect of the present invention, a distance measurement device which can detect a distance with improved resolution and high accuracy can be provided.

DESCRIPTION OF EMBODIMENTS

Figure 1:
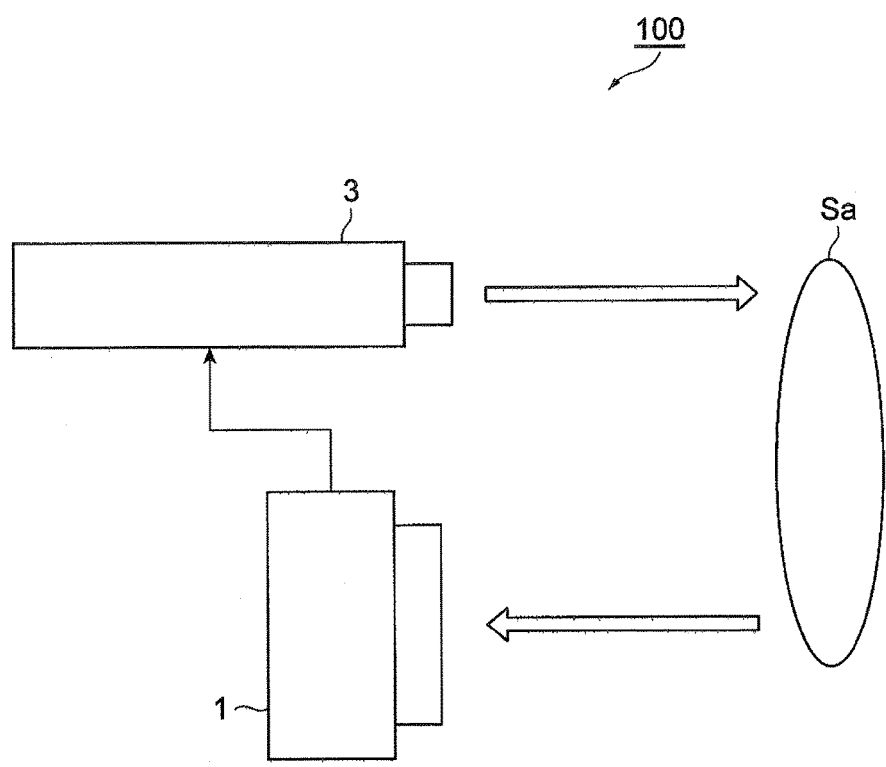
FIG. 1 is a diagram of an outline structure of a measurement system 100 including a camera device 1 which is a distance measurement device according to one embodiment of the present invention.

One embodiment of a distance measurement device according to the present invention will be described in detail below with reference to the drawings. In the description on the drawings, same or corresponding parts are denoted with the same symbol, and overlapped description is omitted. Also, the drawings are created for the description, and parts to be described are drawn to be especially emphasized. Therefore, dimension ratio of components in the drawings does not necessarily coincide with an actual dimension ratio.

FIG. 1 is a diagram of an outline structure of a measurement system 100 including a camera device 1 which is the distance measurement device according to one embodiment of the present invention. The measurement system 100 is used to measure a distance to an object Sa by using a TOF (Time Of Flight) method. The measurement system 100 includes a laser light source 3 which irradiates the object Sa with light and the camera device 1 which detects reflected light from the object Sa and calculates the distance. The laser light source 3 is a light source device capable of irradiating pulse light having a pulse width which is sufficiently shorter than response time of a light receiving unit of the camera device 1 to be described. For example, the laser light source 3 can irradiate the pulse light having the center wavelength of 445 nm and the pulse width of 100 psec. The center wavelength and the pulse width of the light irradiated by the laser light source 3 are not limited to the above values and may be set to various values.

Figure 2:
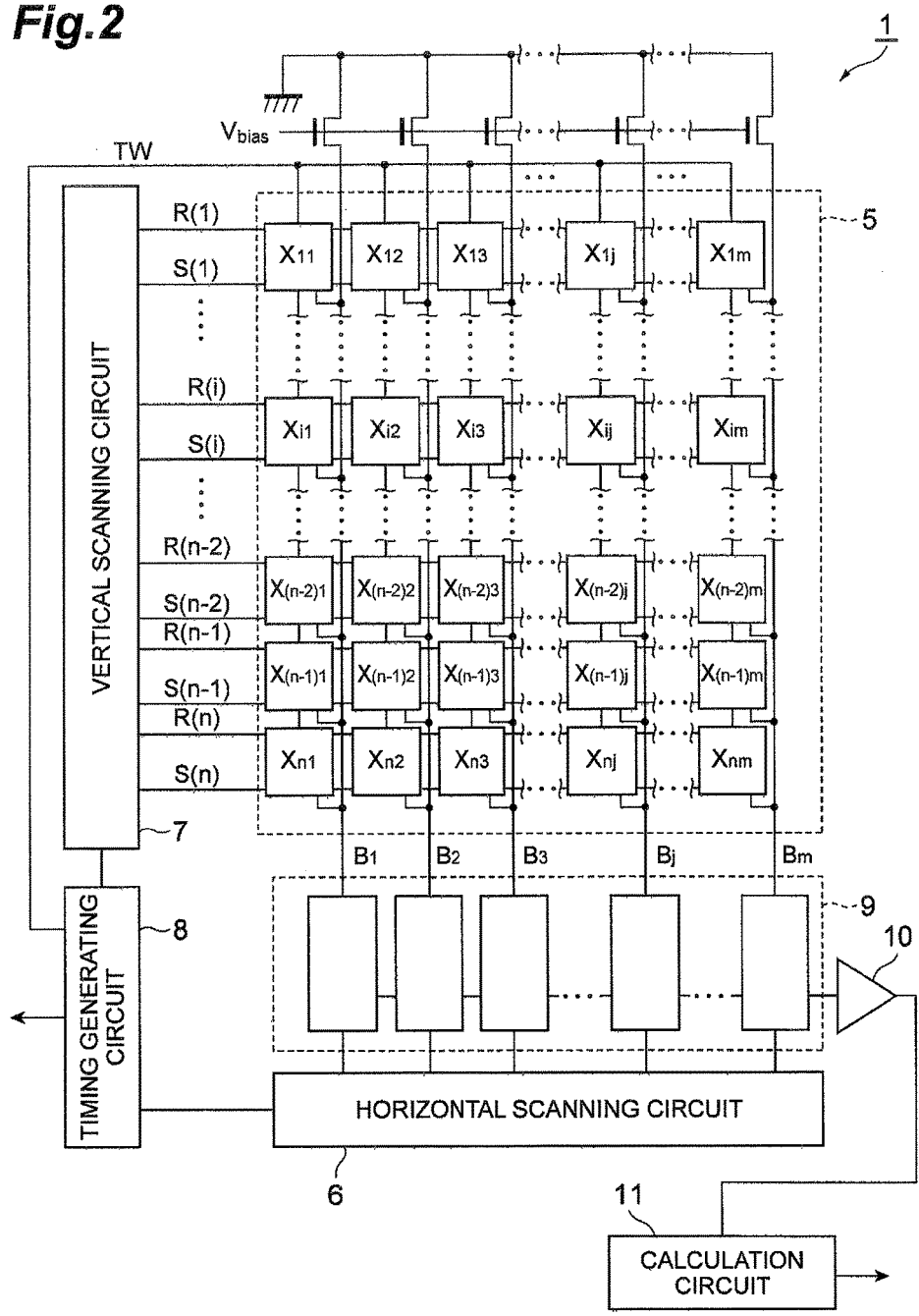
FIG. 2 is a block diagram of an outline structure of the camera device 1 in FIG. 1.

FIG. 2 is a block diagram of a structure of the camera device 1. As illustrated in FIG. 2, the camera device 1 includes a pixel array unit 5 and peripheral circuit units 6, 7, 8, 9, and 10 integrated on a single semiconductor chip, and a circuit unit 11 is formed on another circuit of the camera device 1 outside the semiconductor chip. The circuit unit 11 may be integrated on the same semiconductor chip on which the pixel array unit 5 and the peripheral circuit units 6, 7, 8, 9, and 10 are provided.

In the pixel array unit 5, a large number of pixels (photoelectric conversion device) Xij (i is an integer of 1 to m, and j is an integer of 1 to n) are arrayed in a two dimensional matrix form and form a rectangular imaging region. Around the pixel array unit 5, a horizontal scanning circuit 6 is provided along pixel rows of a plurality of pixels Xij in the horizontal direction, and a vertical scanning circuit 7 is provided along pixel columns of the plurality of pixels Xij in the vertical direction. The horizontal scanning circuit 6 and the vertical scanning circuit 7 are connected to a timing generating circuit (controller) 8.

The timing generating circuit 8, the horizontal scanning circuit 6, and the vertical scanning circuit 7 sequentially scan the pixels Xij in the pixel array unit 5. Then, a pixel signal is read, and initialization is performed. That is, the vertical scanning circuit 7 scans the pixel array unit 5 in the vertical direction by a pixel row so that the pixel signal of each pixel column included in the scanned pixel columns is read by a vertical signal line provided in each pixel column. The pixel signal of each pixel column is read by outputting the signal via a noise canceling circuit 9 and an output buffer circuit 10 provided in each vertical signal line. In addition, at the time of reading the pixel signal of each pixel column, the horizontal scanning circuit 6 scans the pixels Xij in the horizontal direction. The timing generating circuit 8 controls the timing of vertical and horizontal scanning of the pixels Xij of the pixel array unit 5 as described above. Also, the timing generating circuit 8 controls irradiation timing of the pulse light of the laser light source 3 provided in the measurement system 100 and controls timings of the charge storage and the charge discharge in each pixel Xij having the irradiation timing as a standard.

Figure 3:
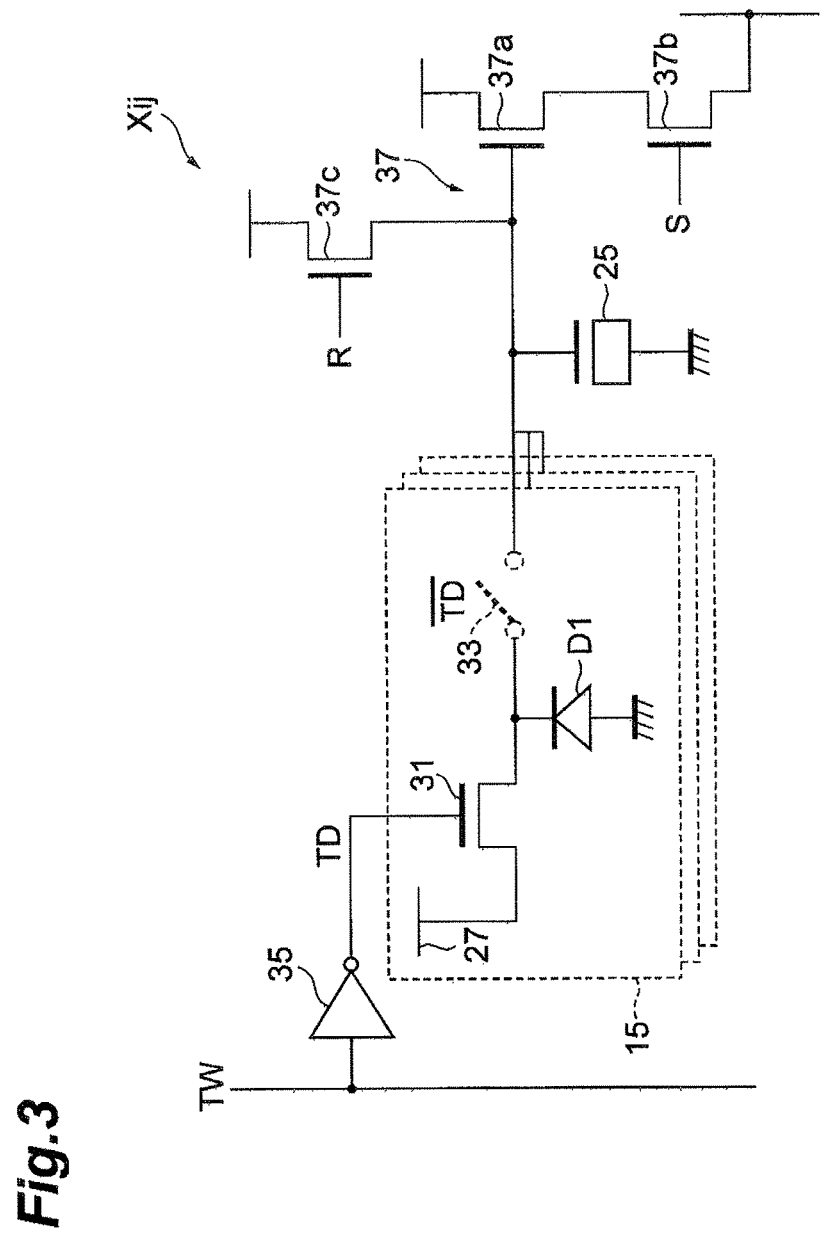
FIG. 3 is a circuit diagram of a structure of a pixel Xij in a pixel array unit 5 in FIG. 2.
Figure 4:
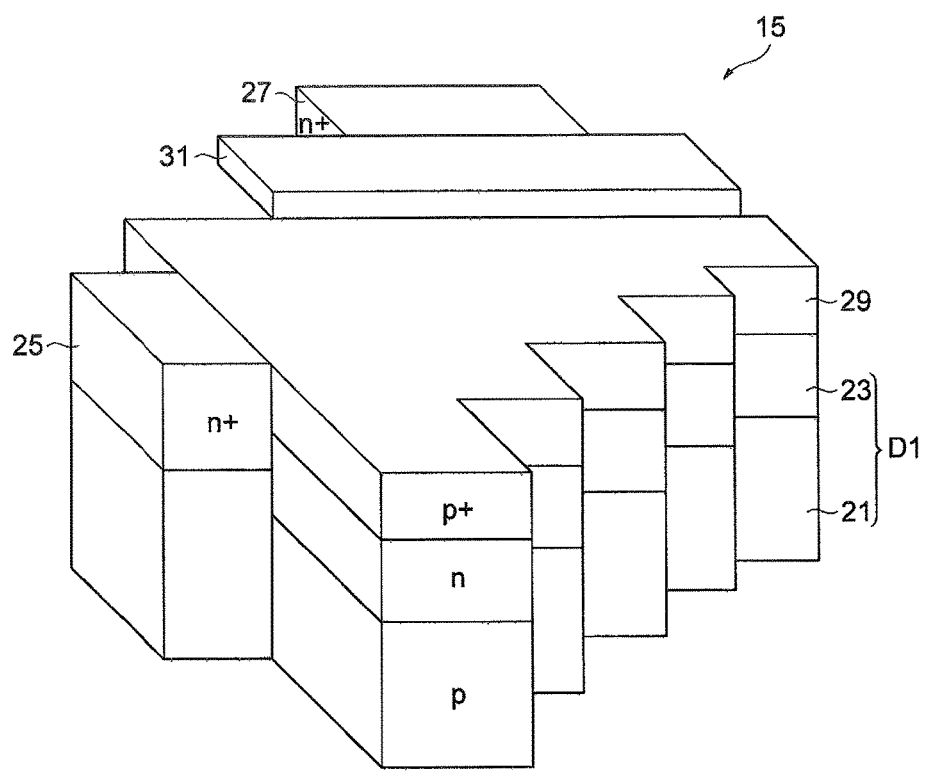
FIG. 4 is a perspective view of a laminated structure of a semiconductor device 15 provided in the pixel Xij in FIG. 3.

FIG. 3 is a circuit diagram of a structure of the pixel Xij in the pixel array unit 5, and FIG. 4 is a perspective view of a laminated structure of the semiconductor device 15 provided in the pixel Xij. As illustrated in FIGS. 3 and 4, a plurality of semiconductor devices 15 which functions as a pixel circuit is arranged and provided in the pixel Xij. In the semiconductor device 15, a first conductivity type (p-type) semiconductor region 21, a second conductivity type (n-type) surface embedded region for receiving light (light receiving unit) 23 which is embedded in a part of the upper part of the semiconductor region 21 and in which the light enters, a second conductivity type ($n^+$-type) charge storage region (charge storage unit) 25, and a second conductivity type ($n^+$-type) discharging drain region (charge discharge unit) 27 are formed. The second conductivity type ($n^+$-type) charge storage region (charge storage unit) 25 is provided in a part of the upper part of the semiconductor region 21 and adjacent to the surface embedded region for receiving light (light receiving unit) 23 and stores a charge generated by the surface embedded region for receiving light (light receiving unit) 23. The second conductivity type ($n^+$-type) discharging drain region (charge discharge unit) 27 is separated and embedded in a part of the upper part of the semiconductor region 21 and adjacent to the surface embedded region for receiving light 23. The discharging drain region 27 is a part to discharge an electron generated by the surface embedded region for receiving light 23 and is provided adjacent to a boundary line for substantially perpendicularly intersecting with a boundary line which has contact with the charge storage region 25 of the surface embedded region for receiving light 23. The surface embedded region for receiving light 23 and the semiconductor region 21 just below the same form an embedded photodiode D1 which converts the reflected light (incident light) from the object Sa into the charge (electron). A first conductivity type epitaxial growth layer which has impurity concentration lower than that of a semiconductor substrate formed on the first conductivity type semiconductor substrate may be used instead of the first conductivity type semiconductor region 21.

Also, a $p^+$-type pinning layer 29 is further arranged on the upper part of the surface embedded region for receiving light 23 of the semiconductor device 15. The pinning layer 29 is a layer to prevent to form the charge on the surface of the embedded photodiode D1 at the time of dark and may be provided to reduce a dark current. In a use in which the dark current does not cause a problem, the pinning layer 29 may be omitted. In addition, between the embedded photodiode D1 on the semiconductor region 21 and the discharging drain region 27, the gate electrode 31 is formed which controls a potential of a transfer channel formed between the embedded photodiode D1 and the discharging drain region 27 and controls discharge of the charge from the embedded photodiode D1 to the discharging drain region 27.

Figure 5:
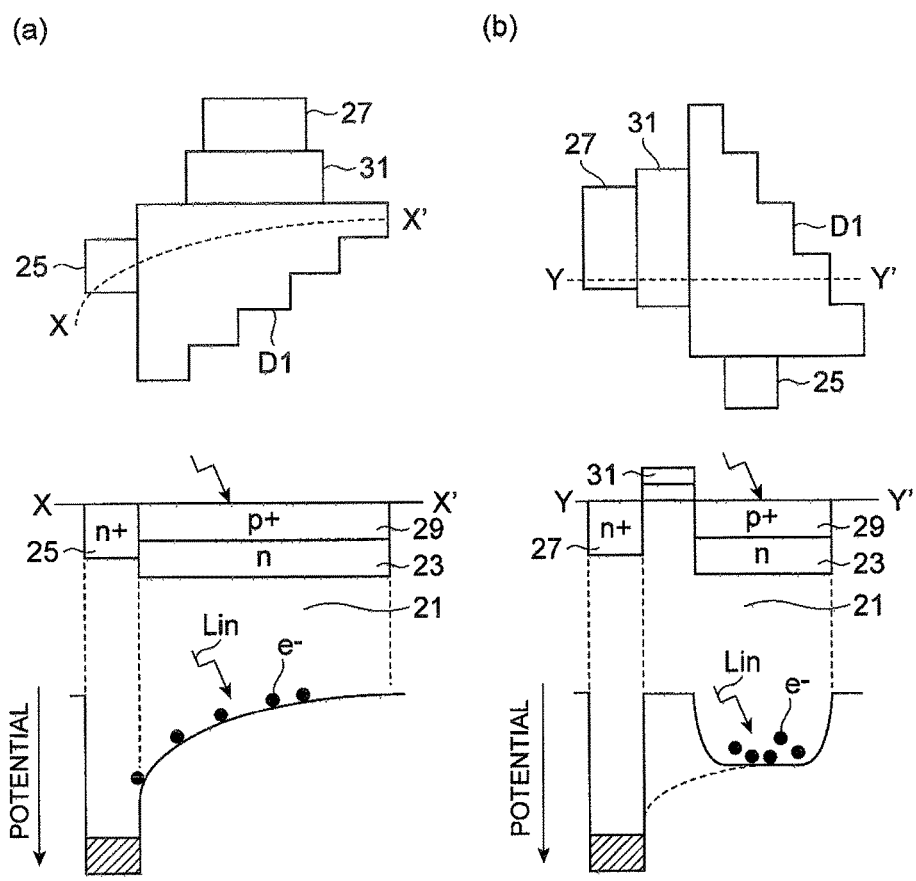
FIGS. 5(a) and 5(b) are diagrams of a potential distribution on a vertical section in a case where a voltage is applied to a gate electrode 31 in the semiconductor device 15 in FIG. 4.

In FIGS. 5(a) and 5(b), a potential distribution on the vertical section of the semiconductor device 15 in a case where the voltage is applied to the gate electrode 31 is illustrated. Specifically, in FIG. 5(a), the potential distribution on the vertical section along an X-X' line from a region of the embedded photodiode D1 to the charge storage region 25 is illustrated, and a potential gradient is formed from the region of the embedded photodiode D1 to the charge storage region 25. Also, in FIG. 5(b), the potential distribution on the vertical section along a Y-Y' line from the region of the embedded photodiode D1 to the discharging drain region 27 is illustrated. A solid line indicates a distribution at the time when a low voltage is applied to a gate voltage, and a dotted line indicates a distribution at the time when a high voltage is applied to the gate electrode 31. In this way, when the low voltage is applied to the gate electrode 31, a potential barrier is formed between the region of the embedded photodiode D1 and the discharging drain region 27. Accordingly, the transfer channel between the region of the embedded photodiode D1 and the discharging drain region 27 is closed, and all the electrons $e^-$ which are generated with incidence of the incident light $L_{in}$ are transferred to the charge storage region 25. On the other hand, when the high voltage is applied to the gate electrode 31, the potential barrier between the region of the embedded photodiode D1 and the discharging drain region 27 is eliminated, and the potential gradient is formed. Accordingly, the transfer channel between the region of the embedded photodiode D1 and the discharging drain region 27 is opened, and all the electrons $e^-$ which are generated with the incidence of the incident light $L_{in}$ are transferred to the discharging drain region 27. That is, when the high voltage is applied to the gate electrode 31, a charge transfer effect of the transfer channel between the region of the embedded photodiode D1 and the discharging drain region 27 is more dominant than that between the region of the embedded photodiode D1 and the charge storage region 25. Therefore, all the generated electrons $e^-$ are transferred to the discharging drain region 27. In this way, the gate electrode 31 also has a function as a virtual switch 33 to control the transfer of the charge from the embedded photodiode D1 to the charge storage region 25.

Returning to FIG. 3, the pixel Xij further includes a buffer circuit 35 which inverts a control pulse voltage TW applied from the timing generating circuit 8 and gives it to the gate electrode 31 as a control pulse voltage TD. Specifically, the buffer circuit 35 is an inverter circuit. By having the buffer circuit 35, a load of the pixel Xij caused by being directly connected to the gate electrode 31 can be reduced, and the waveform of the control pulse voltage TW can be prevented from being deteriorated.

In addition, in the pixel Xij, a reading circuit (charge reading unit) 37 is provided which reads the charges stored in the charge storage region 25 according to the application of the control pulse voltage TW as electrical signals. The reading circuit 37 includes a signal reading transistor 37a, a switching transistor 37b, and a reset transistor 37c. A gate electrode of the signal reading transistor 37a is connected to the charge storage region 25, and a drain electrode of the signal reading transistor 37a is connected to a bias power source. A source electrode of the signal reading transistor 37a is connected to a drain electrode of the switching transistor 37b for selecting the pixel. A source electrode of the switching transistor 37b is connected to the vertical signal line, and a control signal for selection S of the pixel column is given to a gate electrode of the switching transistor 37*b* from the vertical scanning circuit 7. By setting the control signal for selection S to a high level, the switching transistor 37*b* is conducted. The electrical signal with the potential corresponding to the amount of the charges stored in the charge storage region 25 amplified by the signal reading transistor 37*a* is output to the vertical signal line. A source electrode of the reset transistor 37*c* is connected to the charge storage region 25, and a drain electrode is connected to the bias power source. A reset signal R is given to a gate electrode of the reset transistor 37*c* from the vertical scanning circuit 7. When the reset signal R is set to the high level, the reset transistor 37*c* resets the charge storage region 25 by discharging the charges stored in the charge storage region 25.

A calculation circuit (calculation unit) 11 illustrated in FIG. 2 calculates the distance to the object Sa based on the electrical signal read from the pixel Xij by the timing control by the timing generating circuit 8.

Figure 6:
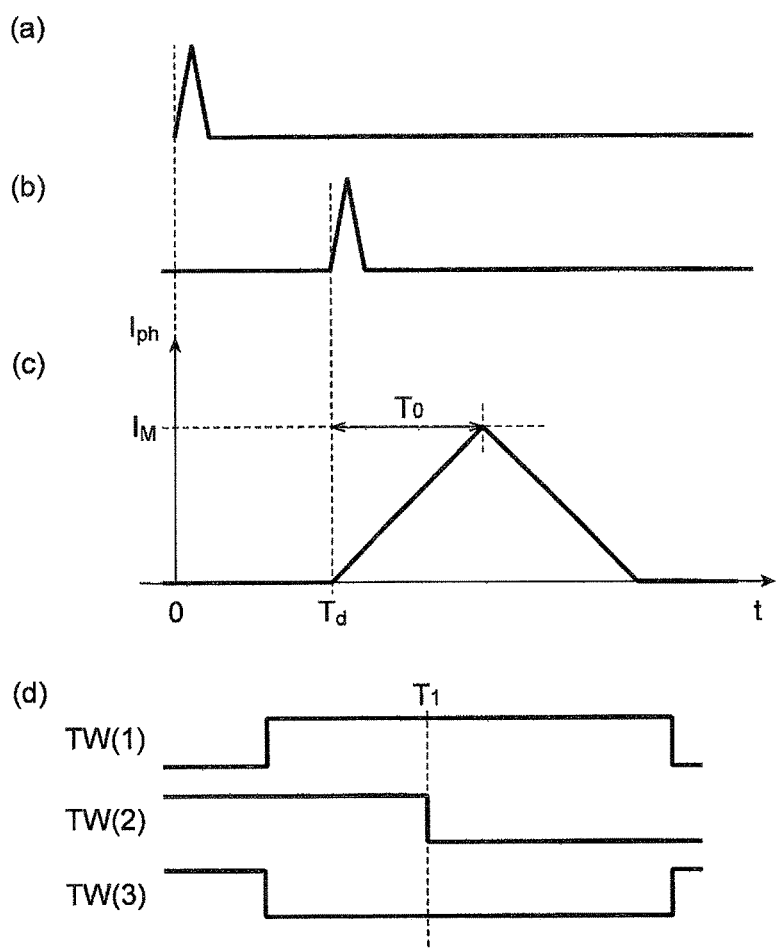
FIGS. 6(a) to 6(d) are timing charts of a light emitting timing and a charge storage timing in the pixel controlled by a timing generating circuit 8 in FIG. 2.

A procedure of a distance calculation operation by the timing generating circuit 8 and the calculation circuit 11 will be described below. FIGS. 6(*a*) to 6(*d*) are timing charts of a light emitting timing and a charge storage timing controlled by the timing generating circuit 8. FIG. 6(*a*) is a time waveform of the pulse light irradiated from the laser light source 3, and FIG. 6(*b*) is a time waveform of the reflected light received by the pixel Xij. FIG. 6(*c*) is a time waveform of a photocurrent $I_{ph}$ which is response characteristics relative to the reflected light of the pixel Xij, and FIG. 6(*d*) is a time waveform of the control pulse voltage TW applied to the gate electrode 31 of the pixel Xij.

First, the timing generating circuit 8 determines the light emitting timing so that the light is repeatedly emitted at a predetermined frequency. A trigger signal is supplied from the timing generating circuit 8 so that the laser light source 3 emits the pulse light at the light emitting timing. According to this, the reflected light enters the pixel Xij with a time difference $t_d$ corresponding to the distance to the object Sa after the light emitting timing. Here, the pulse width of the reflected light for entering the pixel Xij is set to a value which is sufficiently shorter than the response time of the light receiving unit of the pixel Xij (for example, pulse width is equal to or less than 100 psec). As a result, a response waveform of the light receiving unit of the pixel Xij relative to the incident light is almost equal to an impulse response. That is, the response waveform rises to the maximum value $I_M$ from an incident time $t_d$ of the reflected light having the light emitting timing as a standard to response time $T_0$ of the light receiving unit and falls at the response time $T_0$ after that. The response waveform is a waveform which is similar to a single triangular wave.

Corresponding to the response waveform of the pixel Xij, the timing generating circuit 8 performs control to repeatedly generate control pulse voltages TW(1), TW(2), and TW(3) having three kinds of phase differences based on the light emitting timing. Specifically, the control pulse voltage TW(1) is set to be a rectangular pulse wave which becomes high level for a predetermined period after the light emitting timing. Also, the control pulse voltage TW(2) is set to be a rectangular pulse wave which becomes high level from the light emitting timing to a time $T_1$ after the light emitting timing and has a high level section for partially overlapping with that of the control pulse voltage TW(1). Also, the control pulse voltage TW(3) is set to be a rectangular pulse wave which is formed by inverting the control pulse voltage TW(1).

In this way, the timing generating circuit 8 performs control to repeatedly apply the control pulse voltage TW(1) after the light emitting timing. After that, the timing generating circuit 8 performs control to read a first charge stored in the charge storage region 25 as a first electrical signal in accordance with the application of the control pulse voltage TW(1) from the pixel Xij. Also, the timing generating circuit 8 performs control to repeatedly apply the control pulse voltage TW(2) after the light emitting timing. After that, the timing generating circuit 8 performs control to read a second charge stored in the charge storage region 25 as a second electrical signal in accordance with the application of the control pulse voltage TW(2) from the pixel Xij. Similarly, the timing generating circuit 8 performs control to repeatedly apply the control pulse voltage TW(3) after the light emitting timing. After that, the timing generating circuit 8 performs control to read a third charge stored in the charge storage region 25 as a third electrical signal in accordance with the application of the control pulse voltage TW(3) from the pixel Xij.

After that, the calculation circuit 11 converts values of the read first to third electrical signals into the numbers of stored electrons $N_1$, $N_2$, and $N_3$ by normalizing them. Here, an impulse application waveform of the photocurrent of the pixel Xij is approximated by a linear function indicated by the following formula (1).

[formula 1]

$$I_{ph} = \begin{cases} 0 & (t < t_d) \\ \dfrac{I_M}{T_0}(t - t_d) & (t_d \leq t < T_0 + t_d) \\ I_M - \dfrac{I_M}{T_0}(t - t_d - T_0) & (T_0 + t_d \leq t < 2T_0 + t_d) \end{cases} \quad (1)$$

According to the linear function, ideally, the number of electrons stored according to the application of each control pulse voltages TW(1), TW(2), and TW(3) can be calculated by using the following formula (2) in a range in which the time difference $t_d$ is $T_1 - T_0 < t_d \leq T_1$.

[formula 2]

$$\begin{aligned} N_1 &= \int_{t_d}^{t_d + 2T_0} \frac{I_M}{qT_0}(t - t_d)\,dt \\ &= \frac{I_M \cdot T_0}{q} \\ N_2 &= \int_{t_d}^{T_1} \frac{I_M}{qT_0}(t - t_d)\,dt \\ &= \frac{I_M}{2qT_0}(T_1 - t_d)^2 \\ N_3 &= 0 \end{aligned} \quad (2)$$

By using the relation in the formula (2), the calculation circuit 11 calculates the time difference $t_d$ which is the flight time of the light by using the following formula (3). At this time, the calculation circuit 11 calculates a ratio r between values which is obtained by correcting the number of stored electrons $N_1$ and $N_2$ by the number of stored electrons $N_3$.

[formula 3]

$$t_d = T_1 - T_0\sqrt{2r} \qquad (3)$$
$$r = \frac{N_2 - N_3}{N_1 - N_3}$$

In addition, the calculation circuit 11 calculates a distance L to the object Sa based on the calculated time difference $t_d$ by using the following formula (4) while assuming speed of light as c [m/s] and outputs it.

[formula 4]

$$L = \frac{c}{2}(T_1 - \sqrt{2r}\,T_0) \qquad (4)$$

A range of the distance L which can be measured by the formula (4) is a range of a value calculated by using the following formula (5) and is proportional to the response time $T_0$ of the impulse response of the pixel Xij.

[formula 5]

$$\frac{c}{2}T_0\left(\frac{c}{2}(T_1 - T_0) < L \leq \frac{c}{2}T_1\right) \qquad (5)$$

Also, a resolution $\sigma_L$ of the distance L which can be measured in a state where a shot noise is dominant is a value calculated by using the following formula (6). The resolution $\sigma_L$ is inversely proportional to the square root of the number of stored electrons $N_1$ and is proportional to the response time $T_0$ of the impulse response of the pixel Xij. For example, when the number of stored electrons $N_1 = 10^6$, the response time $T_0 = 100$ psec, and parameter r can be 0 to 0.5, a range of the measurable distance L is 15 mm, and the measurable resolution $\sigma_L$ is of 10.6 μm to 13 μm.

[formula 6]

$$\sigma_L = \frac{cT_0}{2}\sqrt{\frac{1+r}{2N_1}} \qquad (6)$$

According to the camera device 1 described above, an irradiation timing of the pulse light having the pulse width, which is sufficiently shorter than the response time of the light receiving unit of the pixel Xij, relative to the object Sa is controlled, and control pulse voltages TW(1) and TW(2) having two kinds of phases based on the irradiation timing are applied to the gate electrode 31. Accordingly, the charge converted according to the incidence of the pulse light by the light receiving unit of the pixel Xij can be stored in the charge storage region 25 by modulating it. The first and second charges modulated by the control pulse voltages TW(1) and TW(2) having two kinds of phases are respectively read as the first and second electrical signals by the reading circuit 37, and the distance to the object Sa is calculated based on the first and second electrical signals. In this way, the distance is calculated by using the response characteristics of the impulse light of the light receiving unit of the pixel Xij. Therefore, deterioration in measurement accuracy caused by deterioration in a sensor response waveform according to the change of a time width of the incident light waveform can be prevented. As a result, distance detection with improved resolution and high accuracy can be realized.

Figure 11:
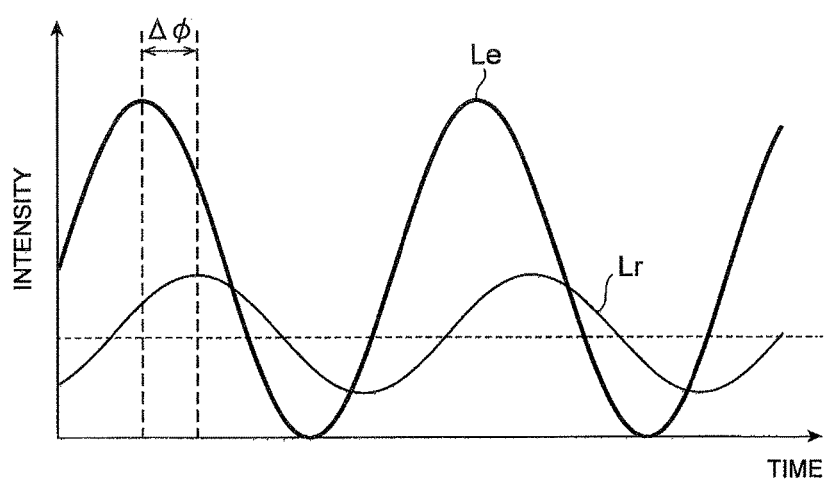
FIG. 11 is a timing chart of time waveforms of irradiation light $L_e$ irradiated to an object and detected reception light $L_r$ in a distance measurement image sensor of a conventional sinusoidal wave modulation system.

An effect of the improvement of the measurement accuracy by the camera device 1 will be specifically described as compared with a conventional system. In FIG. 11, time waveforms of the irradiation light $L_e$ irradiated to the object and the detected reception light $L_r$ in the distance measurement image sensor of the conventional sinusoidal wave modulation system are illustrated. In the conventional sinusoidal wave modulation system, a phase lag $\Delta\varphi$ of the reception light $L_r$ relative to the irradiation light $L_e$ is detected, and the distance d to the object is calculated based on the phase lag $\Delta\varphi$ by using the following formula (7)

[formula 7]

$$d = \frac{c\Delta\varphi}{4\pi f_m} \qquad (7)$$

($f_m$ is a modulation frequency). Here, the range L and the resolution $\sigma_L$ of the distance d which can be measured in this case are calculated by using the following formula (8). The range L of the distance d is inversely proportional to the modulation frequency $f_m$. Also, the resolution $\sigma_L$ of the measurable distance d is inversely proportional to the modulation frequency $f_m$ and is inversely proportional to the square root of the number of stored electrons $N_S$.

[formula 8]

$$\text{Range: } L = \frac{c}{2f_m} \qquad (8)$$
$$\sigma_L = \frac{L}{4\sqrt{N_S}} = \frac{c}{2}\frac{1}{4f_m\sqrt{N_S}}$$

For example, when it is desired that the distance resolution be equal to or less than 10 μm in a case where the number of stored electrons Ns=$10^6$, it is necessary to set the modulation frequency fm to 3.75 GHz. The realization of such a modulation frequency is not realistic, because it is difficult to supply a modulation gate pulse for lock-in detection.

Figure 12:
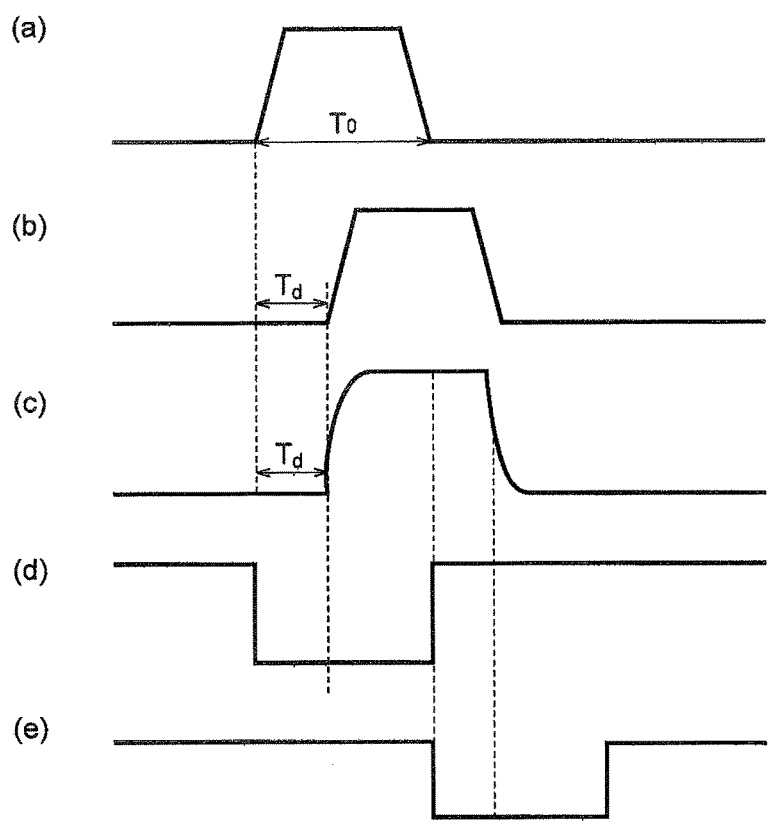
FIGS. 12(a) to 12(e) are timing charts of time waveforms of various signals used by a distance measurement image sensor of a conventional pulse modulation system.

Also, in FIGS. 12(a) to 12(e), time waveforms of various signals used by the distance measurement image sensor of the conventional pulse modulation system are illustrated. FIG. 12(a) is a time waveform of the irradiation light irradiated to the object, and FIG. 12(b) is a time waveform of the detected reflected light. FIG. 12(c) is a time waveform of an amount of charges detected by the sensor, and FIGS. 12(d) and 12(e) are time waveforms of two kinds of phases of modulation gate pulses applied to the sensor. The range L and the resolution $\sigma_L$ of the measurable distance in this case are calculated by using the following formula (9). The range L of the distance is proportional to the pulse width $T_0$ of the irradiation light. Also, the resolution $\sigma_L$ of the measurable distance is proportional to the pulse width $T_0$ of the irradiation light and is inversely proportional to the square root of the number of stored electrons $N_S$.

[formula 9]

$$\text{Range: } L = \frac{cT_0}{2} \quad (9)$$

$$\sigma_L = \frac{L}{\sqrt{N_S}} = \frac{c}{2}\frac{T_0}{\sqrt{N_S}}$$

For example, when it is desired that the distance resolution be equal to or less than 10 μm in a case where the number of stored electrons $N_s=10^6$, it is necessary to set the pulse width $T_0$ of the irradiation light to a value equal to or less than 67 psec. It is difficult to generate illumination light having such a narrow pulse width with high accuracy. As a result, with the sinusoidal wave modulation system and the pulse modulation system of the conventional system, it is difficult to maintain the accuracy of the measurement while the resolution of the measurement is reduced.

Whereas, according to the camera device 1 of the present embodiment, the distance is calculated by using the impulse response of the light receiving unit by using the irradiation light having the pulse width which is sufficiently shorter than the response time of the light receiving unit of the pixel Xij. Therefore, it is not necessary to improve the modulation frequency in order to improve the resolution. As a result, an effect of distortion of the waveform of the irradiation light from the light source and an effect of distortion of the response waveform of the light receiving unit are small. Concurrently, supply of the modulation gate pulse can be easily realized.

Especially, the calculation circuit 11 of the camera device 1 calculates the distance by approximating the impulse response characteristics of the light receiving unit of the pixel Xij to the linear function. Therefore, the resolution of the measured distance is determined by the number of stored electrons $N_1$ of the light receiving unit of the pixel Xij and the response time $T_0$ of the light receiving unit. According to this, deterioration in the measurement accuracy due to the deterioration in the sensor response waveform according to the change of the time width of the incident light waveform and deterioration in the response waveform according to the change of the modulation frequency can be surely prevented.

Also, the calculation circuit 11 calculates the distance after the numbers of stored electrons $N_1$ and $N_2$ have been corrected by the number of stored electrons $N_3$. In this case, since an offset charge included in the numbers of stored electrons $N_1$ and $N_2$ can be canceled, the accuracy of the calculated distance can be further improved.

In addition, since the pixel Xij has a plurality of semiconductor devices 15 arranged therein, a traveling distance of the charge can be shortened without changing a light receiving area of the pixel Xij. As a result, both light receiving sensitivity and high-speed modulation can be achieved, and sensitivity to measure the distance and a response speed can be improved.

In addition, since the pixel Xij further includes the buffer circuit 35, the control pulse voltage is applied to the gate electrode 31 via the buffer circuit 35 with a small load. Therefore, the deterioration in the waveform of the control pulse voltage is prevented, and the accuracy of the measured distance can be improved.

Figure 7:
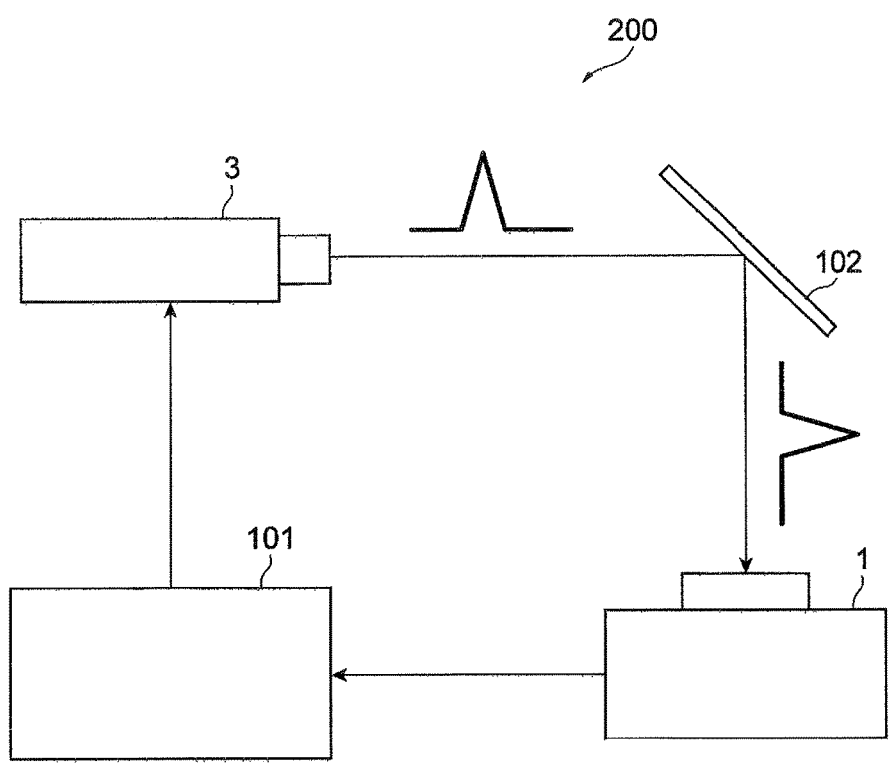
FIG. 7 is a diagram of an outline structure of a measurement system 200 including the camera device 1 in FIG. 1.
Figure 8:
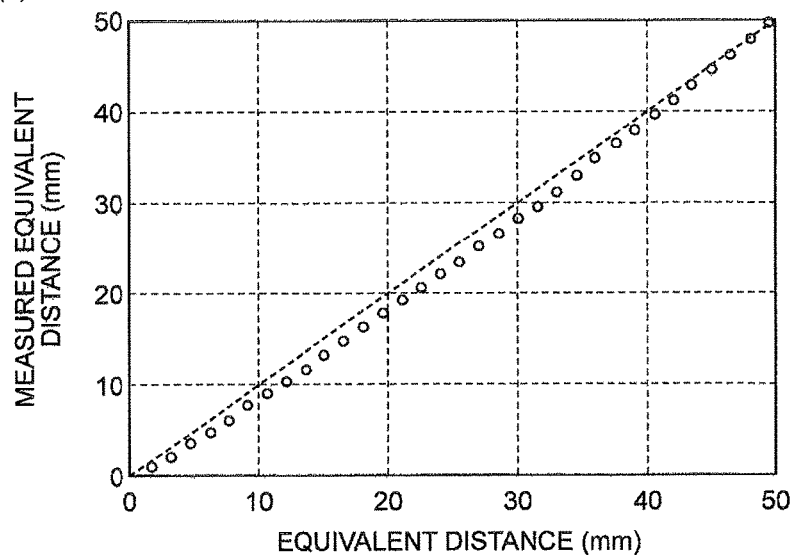
FIGS. 8(a) and 8(b) are graphs of accuracy of the measured distance by the camera device 1 which has been evaluated by using the measurement system 200 in FIG. 7 and resolution of the measured distance.
Figure 8:
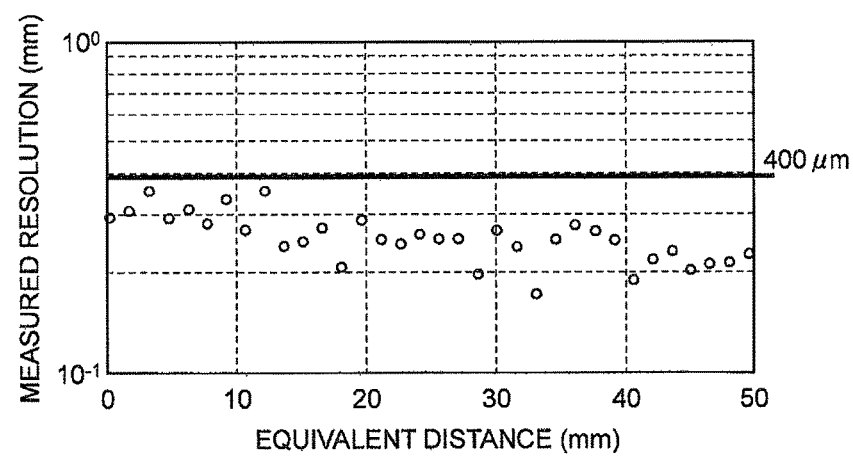

Here, evaluation results of the distance measurement by the camera device 1 are indicated. In FIG. 7, a structure of the measurement system 200 used for the evaluation is illustrated. The measurement system 200 includes a digital delay generator 101 and a mirror 102 in addition to the camera device 1 and the laser light source 3. A trigger signal output from the camera device 1 is delayed by various delay times and is input to the laser light source 3 via the digital delay generator 101. The laser light, which is emitted from the laser light source 3 according to the input, is received by the camera device 1 by reflecting laser light by the mirror 102. The measurement system 200 equivalently changes the distance to the object and evaluates the measured distance calculated by the camera device 1 relative to the distance. FIGS. 8(*a*) and 8(*b*) are graphs of the accuracy of the measured distance evaluated by the measurement system 200 and the resolution of the measured distance. According to the above result, it has been found that accuracy of non-linearity which is equal to or less than five % is maintained when the range of the distance is of 0 to 50 mm and the distance resolution equal to or less than about 400 μm is realized when the range of the distance is of 0 to 50 mm.

The present invention is not limited to the above-mentioned embodiment.

Figure 9:
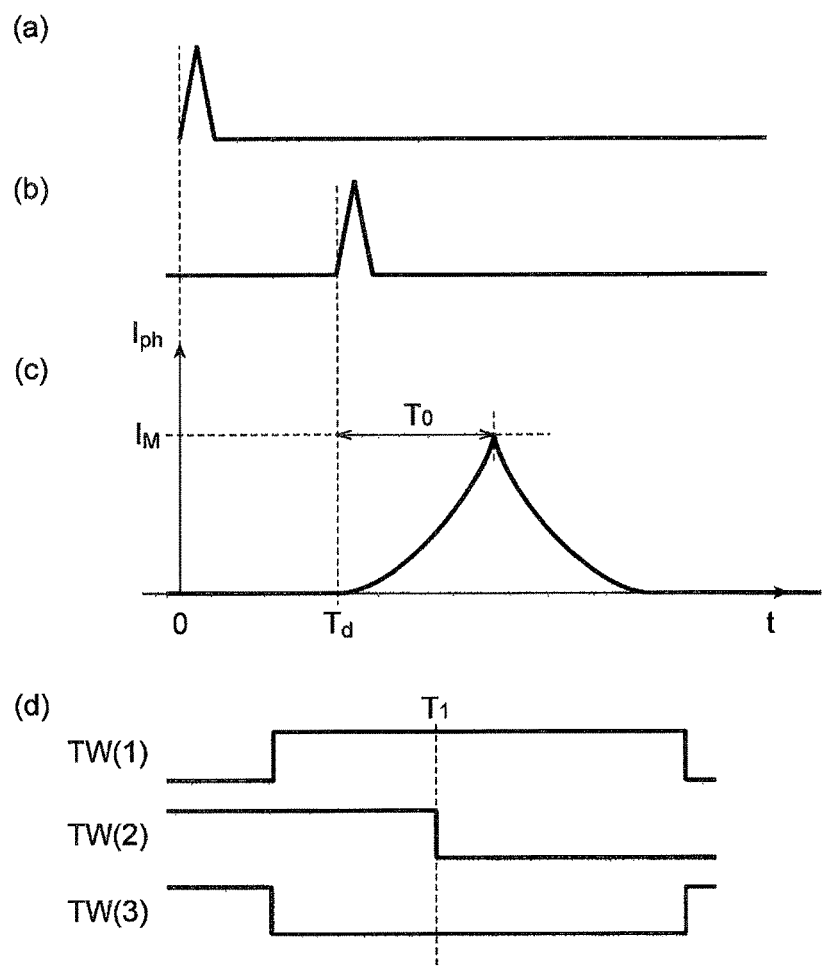
FIGS. 9(a) to 9(d) are timing charts of a light emitting timing and a charge storage timing in the pixel according to a modification of the present invention.

For example, the calculation circuit 11 of the camera device 1 has calculated the distance by approximating the response characteristics of the light receiving unit of the pixel Xij by the linear function. However, the response characteristics may be approximated by other quadratic or higher-order functions. FIGS. 9(*a*) to 9(*d*) are timing charts of the light emitting timing and the charge storage timing by the camera device 1 by using approximation by the quadratic function. FIG. 9(*a*) is a time waveform of the pulse light emitted from the laser light source 3, and FIG. 9(*b*) is a time waveform of the reflected light received by the pixel Xij. FIG. 9(*c*) is a time waveform of a photocurrent $I_{ph}$ approximated as the response characteristics relative to the reflected light of the pixel Xij, and FIG. 9(*d*) is a time waveform of a control pulse voltage TW applied to the gate electrode 31 of the pixel Xij. In this case, a response waveform of the photocurrent $I_{ph}$ is approximated by the quadratic function as indicated by the following formula (10).

[formula 10]

$$I_{ph} = \begin{cases} 0 & (t < t_d) \\ \frac{I_M}{T_0^2}(t-t_d)^2 & (t_d \leq t < T_0 + t_d) \\ I_M - \frac{I_M}{T_0^2}(t-t_d-T_0)^2 & (T_0 + t_d \leq t < 2T_0 + t_d) \end{cases} \quad (10)$$

According to the quadratic function, ideally, the number of electrons stored according to the application of each control pulse voltage TW(1), TW(2), and TW(3) can be calculated by using the following formula (11).

[formula 11]

$$N_1 = \int_{t_d}^{t_d+2T_0} \frac{I_M}{qT_0^2}(t-t_d)^2 \, dt \quad (11)$$

$$N_2 = \int_{t_d}^{T_1} \frac{I_M}{qT_0^2}(t-t_d)^2 \, dt$$

$$N_3 = 0$$

By using this relation, the calculation circuit 11 calculates the time difference $t_d$ which is the flight time of the light by using the following formula (12).

[formula 12]

$$t_d = T_1 - T_0\left(\frac{3}{2}r\right)^{\frac{1}{3}} \quad (12)$$

$$r = \frac{N_2 - N_3}{N_1 - N_3}$$

In addition, the calculation circuit 11 can calculate the distance L to the object Sa by using the following formula (13) and output it.

[formula 13]

$$L = \frac{c}{2}\left(T_1 - T_0\left(\frac{3}{2}r\right)^{\frac{1}{3}}\right) \quad (13)$$

Figure 10:
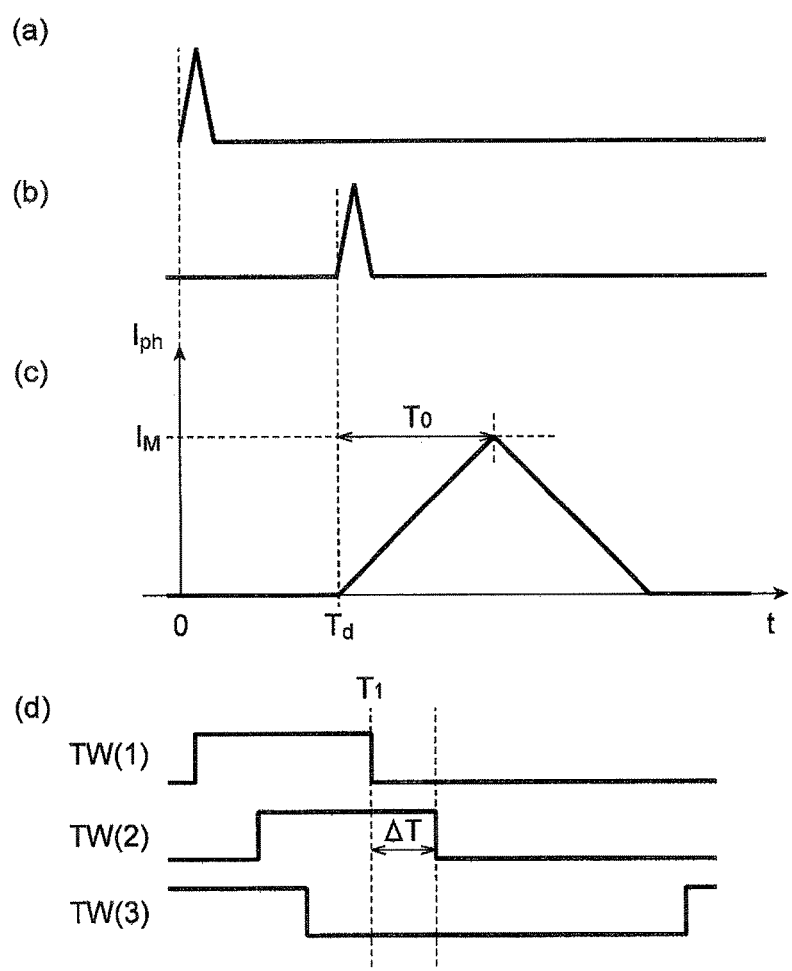
FIGS. 10(a) to 10(d) are timing charts of the light emitting timing and the charge storage timing in the pixel according to the modification of the present invention.

Also, the calculation circuit 11 of the camera device 1 may calculate the distance by using a delay difference ΔT between the two kinds of control pulse voltages TW(1) and TW(2) applied to the gate electrode 31 of the pixel Xij. In FIGS. 10(a) to 10(d), timing charts of the light emitting timing and the charge storage timing by the camera device 1 by using the delay difference ΔT are illustrated. FIG. 10(a) is a time waveform of the pulse light emitted from the laser light source 3, and FIG. 10(b) is a time waveform of the reflected light received by the pixel Xij. FIG. 10(c) is a time waveform of the photocurrent $I_{ph}$ which is the response characteristics relative to the reflected light of the pixel Xij, and FIG. 10(d) is a time waveform of the control pulse voltage TW applied to the gate electrode 31 of the pixel Xij. In this case, the control pulse voltage TW(2) is set to be delayed with time of the delay difference ΔT relative to the control pulse voltage TW(1). Also, the control pulse voltage TW(3) is set to be high level in a section in which the response characteristics of the reflected light becomes zero. At this time, the response waveform of the photocurrent $I_{ph}$ is approximated by the linear function indicated by the formula (1). According to the linear function, ideally, the number of electrons stored according to the application of each control pulse voltage TW(1), TW(2), and TW(3) can be calculated by using the following formula (14).

[formula 14]

$$N_1 = \int_{t_d}^{T_1} \frac{I_M}{qT_0}(t - t_d)\,dt \quad (14)$$

$$N_2 = \int_{t_d}^{T_1 + \Delta T} \frac{I_M}{qT_0}(t - t_d)\,dt$$

$$N_3 = 0$$

By using this relation, the calculation circuit 11 calculates the time difference $t_d$ which is the flight time of the light by using the following formula (15).

[formula 15]

$$t_d = T_1 + \frac{\Delta T}{1 - r^{1/2}} \quad (15)$$

$$r = \frac{N_1 - N_3}{N_2 - N_3}$$

In addition, the calculation circuit 11 can calculate the distance L to the object Sa by using the following formula (16) and output it.

[formula 16]

$$L = \frac{c}{2}\left(T_1 + \frac{\Delta T}{1 - r^{1/2}}\right) \quad (16)$$

The resolution $\sigma_L$ of the distance, which can be measured in this case is calculated by using the following formula (17). The resolution $\sigma_L$ of the measurable distance is proportional to the delay difference ΔT and is inversely proportional to the square root of the number of stored electrons $N_2$.

[formula 17]

$$\sigma_L = \frac{c}{4}\frac{\Delta T}{\sqrt{N_2}}\left(\frac{(1 + r)^{1/2}}{(1 - r^{1/2})}\right) \quad (17)$$

The camera device 1 which calculates the distance by using the quadratic function as the response characteristics described above and the camera device 1 which calculates the distance by using the delay difference ΔT can realize distance detection with improved resolution and high accuracy.

REFERENCE SIGNS LIST

D1 . . . embedded photodiode (light receiving unit)
Sa . . . object
1 . . . camera device (distance measurement device)
3 . . . laser light source
5 . . . pixel array unit
6 . . . horizontal scanning circuit
7 . . . vertical scanning circuit
8 . . . timing generating circuit (controller)
10 . . . output buffer circuit
11 . . . calculation circuit (calculation unit)
15 . . . semiconductor device
23 . . . surface embedded region for receiving light (light receiving unit)
25 . . . charge storage region (charge storage unit)
27 . . . discharging drain region (charge discharge unit)
31 . . . gate electrode,
35 . . . buffer circuit
37 . . . reading circuit (charge reading unit)
100 . . . measurement system
Xij . . . pixel (photoelectric conversion device)

The invention claimed is:

1. A distance measurement device comprising:
a photoelectric conversion device configured to include a light receiving unit for converting an incident light reflected from an object into a charge, a charge storage unit for storing the charge, a charge discharge unit for discharging the charge, and a gate electrode for controlling transfer of the charge from the light receiving unit to the charge storage unit and transfer of the charge from the light receiving unit to the charge discharge unit;
a controller configured to:
control an irradiation timing of a pulse light directed to the object, wherein the pulse light has a pulse width which is sufficiently shorter than a response time of the light receiving unit, so as for a response waveform of the light receiving unit relative to the incident light to be associated with an impulse response;

perform control to generate a first and second control pulse voltage signals having a phase offset relative to each other, based on the irradiation timing; and perform control to apply the first and second control pulse voltage signals to the gate electrode;

a charge reading unit configured to read a first and second charges stored in the charge storage unit according to the applications of the respective first and second control pulse voltage signals, as a first and second electrical signals; and a calculation unit configured to calculate a distance to the object based on the first and second electrical signals.

2. The distance measurement device according to claim 1, wherein
the calculation unit calculates the distance based on a ratio between the first and second electrical signals by approximating a characteristic of the impulse response characteristics of the light receiving unit.

3. The distance measurement device according to claim 2, wherein
the calculation unit approximates the characteristic of the impulse response of the light receiving unit by a linear function or a quadratic function.

4. The distance measurement device according to claim 1, wherein
the controller performs control to generate a third control pulse voltage signal having another phase offset relative to the first and second control pulse voltage signals,
the charge reading unit further reads a third charge stored in the charge storage unit according to the application of the third control pulse voltage signal as a third electrical signal, and
the calculation unit calculates the distance to the object based on the first and second electrical signals corrected by the third electrical signal.

5. The distance measurement device according to claim 4, wherein
the photoelectric conversion device further includes a buffer circuit, and
the first, second and third control pulse voltage signals are applied to the gate electrode via the buffer circuit.

6. The distance measurement device according to claim 1, wherein
the photoelectric conversion device includes a plurality of the light receiving units arranged in the photoelectric conversion device.

7. The distance measurement device according to claim 1, wherein
the photoelectric conversion device further includes a buffer circuit, and
the first and second control pulse voltage signals are applied to the gate electrode via the buffer circuit.

8. The distance measurement device according to claim 1, wherein
the pulse width of the pulse light is less than 100 psec.

9. The distance measurement device according to claim 1, wherein
the response time of the light receiving unit is 100 psec.

10. The distance measurement device according to claim 1, wherein
the response waveform of the light receiving unit relative to the incident light is substantially a single triangular wave.

11. A distance measurement system comprising:
a light source;
a photoelectric conversion device configured to include a light receiving unit for converting an incident light reflected from an object into a charge, a charge storage unit for storing the charge, a charge discharge unit for discharging the charge, and a gate electrode for controlling transfer of the charge from the light receiving unit to the charge storage unit and transfer of the charge from the light receiving unit to the charge discharge unit;
a controller configured to:
control an irradiation timing of a pulse light from the light source directed to the object, wherein the pulse light has a pulse width which is sufficiently shorter than a response time of the light receiving unit, so as for a response waveform of the light receiving unit relative to the incident light to be associated with an impulse response;
perform control to generate a first and second control pulse voltage signals having a phase offset relative to each other, based on the irradiation timing; and
perform control to apply the first and second control pulse voltage signals to the gate electrode;
a charge reading unit configured to read a first and second charges stored in the charge storage unit according to the applications of the respective first and second control pulse voltage signals, as a first and second electrical signals; and
a calculation unit configured to calculate a distance to the object based on the first and second electrical signals.

12. A distance measurement system according to claim 11, wherein
the pulse width of the pulse light is less than 100 psec and a center wavelength of the pulse light is 445 nm.

13. The distance measurement system according to claim 11, wherein
the response time of the light receiving unit is 100 psec.

14. The distance measurement system according to claim 11, wherein
the response waveform of the light receiving unit relative to the incident light is substantially a single triangular wave.

* * * * *